United States Patent
Lee et al.

(10) Patent No.: US 9,362,091 B2
(45) Date of Patent: Jun. 7, 2016

(54) SUBSTRATE TREATING APPARATUS AND BLOCKER PLATE ASSEMBLY

(71) Applicant: SAMSUNG ELECTRONICS CO., LTD., Suwon-Si, Gyeonggi-Do (KR)

(72) Inventors: Soyoung Lee, Suwon-Si (KR); Suho Lee, Seongnam-Si (KR); Chang-Yun Lee, Hwaseong-Si (KR); Ik Soo Kim, Yongin-Si (KR); Juhyun Lee, Suwon-Si (KR); Jongwon Hong, Hwaseong-Si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 130 days.

(21) Appl. No.: 14/463,166

(22) Filed: Aug. 19, 2014

(65) Prior Publication Data

US 2015/0167705 A1    Jun. 18, 2015

(30) Foreign Application Priority Data

Dec. 17, 2013    (KR) .................. 10-2013-0157325

(51) Int. Cl.
*H01L 21/306* (2006.01)
*C23F 1/00* (2006.01)
*H01J 37/32* (2006.01)
(Continued)

(52) U.S. Cl.
CPC ..... *H01J 37/32449* (2013.01); *C23C 16/45565* (2013.01); *C23C 16/45574* (2013.01); *C23C 16/45589* (2013.01); *C23C 16/45591* (2013.01); *C23C 16/50* (2013.01); *H01J 37/3244* (2013.01); *H01J 37/32357* (2013.01); *H01J 37/32807* (2013.01)

(58) Field of Classification Search
CPC ............... H01J 37/32449; C23C 16/45589
USPC ................................... 156/345.34
See application file for complete search history.

(56) References Cited

U.S. PATENT DOCUMENTS 6,444,037 B1    9/2002    Frankel et al.
7,829,145 B2    11/2010   Balasubramanian et al.
(Continued)

FOREIGN PATENT DOCUMENTS

JP    2001053065    2/2001
JP    3289806       3/2002
(Continued)

OTHER PUBLICATIONS

English Astract for Publication No. JPH0888184 (For JP3289806), Mar. 22, 2002.
(Continued)

*Primary Examiner* — Keath Chen
(74) *Attorney, Agent, or Firm* — F. Chau & Associates, LLC

(57) ABSTRACT

A substrate treating apparatus includes a chamber that encloses an internal space; a susceptor in a lower part of the internal space; a shower head in an upper part of the internal space and spaced above the susceptor and that includes a plurality of distribution holes; and a blocker plate assembly that comprises a body having a plurality of intake holes that divides a space between a top wall of the chamber and the shower head into an upper intake space and a lower distribution space, a ring-shaped partition rib on an upper surface of the body, and a ring-shaped distribution unit on a lower surface of the body.

12 Claims, 10 Drawing Sheets

(51) Int. Cl.
*C23C 16/455* (2006.01)
*C23C 16/50* (2006.01)

(56) References Cited

U.S. PATENT DOCUMENTS

| | | |
|---|---|---|
| 2002/0009868 A1 | 1/2002 | Tobashi et al. |
| 2002/0069969 A1* | 6/2002 | Rose ............... C23C 16/45565 156/345.34 |
| 2003/0019580 A1* | 1/2003 | Strang ............. C23C 16/45565 156/345.33 |
| 2006/0174827 A1 | 8/2006 | Bae et al. |
| 2010/0136216 A1 | 6/2010 | Tsuei et al. |
| 2012/0103264 A1 | 5/2012 | Choi et al. |
| 2012/0135145 A1 | 5/2012 | Je et al. |
| 2013/0004681 A1 | 1/2013 | Tso et al. |

FOREIGN PATENT DOCUMENTS

| | | |
|---|---|---|
| JP | 3725325 | 9/2005 |
| JP | 2012126968 | 7/2012 |
| KR | 10-2007-0045513 | 5/2007 |
| KR | 10-2011-0055838 | 5/2011 |
| KR | 10-2012-0009596 | 2/2012 |
| KR | 10-2012-0016955 | 2/2012 |

OTHER PUBLICATIONS

English Astract for Publication No. JPH11265884 (For JP3725325), Sep. 30, 2005.

* cited by examiner

SUBSTRATE TREATING APPARATUS AND BLOCKER PLATE ASSEMBLY

CROSS-REFERENCE TO RELATED APPLICATIONS

This application claims priority under 35 U.S.C. §119 from Korean Patent Application No. 10-2013-0157325 filed on Dec. 17, 2013, in the Korean Intellectual Property Office, and all the benefits accruing therefrom, the contents of which are herein incorporated by reference in their entirety.

BACKGROUND

Embodiments of the inventive concept are directed to a substrate treating apparatus and a blocker plate assembly.

Plasma can be used for treating a substrate. For example, a thin film may be deposited on a surface of a substrate through Plasma Enhanced Chemical Vapor Deposition (PECVD). At this time, process gas excited to a plasma state is applied onto a top surface of the substrate to deposit a thin film on the top surface of the substrate through a chemical reaction. The process gas plasma may also be applied onto a top surface for an etching process.

As the amount of process gas applied to the top surface of the substrate varies by location, the thickness of a thin film deposited on the substrate may vary. In addition, etched areas of the substrate may differ in size from each other.

SUMMARY

Embodiments of the inventive concept may provide a substrate treating apparatus and a blocker plate assembly capable of adjusting the amount of process gas to be applied onto a substrate.

One embodiment of the inventive concept is directed to a substrate treating apparatus which comprises a chamber that encloses an internal space; a susceptor that is located in a lower part of the internal space; a shower head that is located in an upper part of the internal space spaced above the susceptor and that includes a plurality of distribution holes; and a blocker plate assembly that comprises a body having a plurality of intake holes and that divides a space between a top wall of the chamber and the shower head into an upper intake space and a lower distribution space, a ring-shaped partition rib on an upper surface of the body, and a ring-shaped distribution unit on a lower surface of the body.

Another embodiment of the inventive concept is directed to a blocker plate assembly that comprises a plate-shaped body that includes a plurality of intake holes; a ring-shaped partition rib disposed on an upper surface of the body; and a ring-shaped distribution unit disposed on a lower surface of the body that is configured to adjust height.

Another embodiment of the inventive concept is directed to a substrate treating apparatus, including a chamber that encloses an internal space; a shower head that is located in an upper part of the internal space that includes a plurality of distribution holes; and a blocker plate assembly that comprises a body that divides a space between a top wall of the chamber and the shower head into an upper intake space and a lower distribution space and that includes a plurality of intake holes, a ring-shaped partition rib on an upper surface of the body, and a ring-shaped distribution unit on a lower surface of the body opposite the ring-shaped partition rib. The wherein the distribution unit has a height below the body that is adjustable and is configured to come in contact with the shower head.

DETAILED DESCRIPTION

Figure 1:
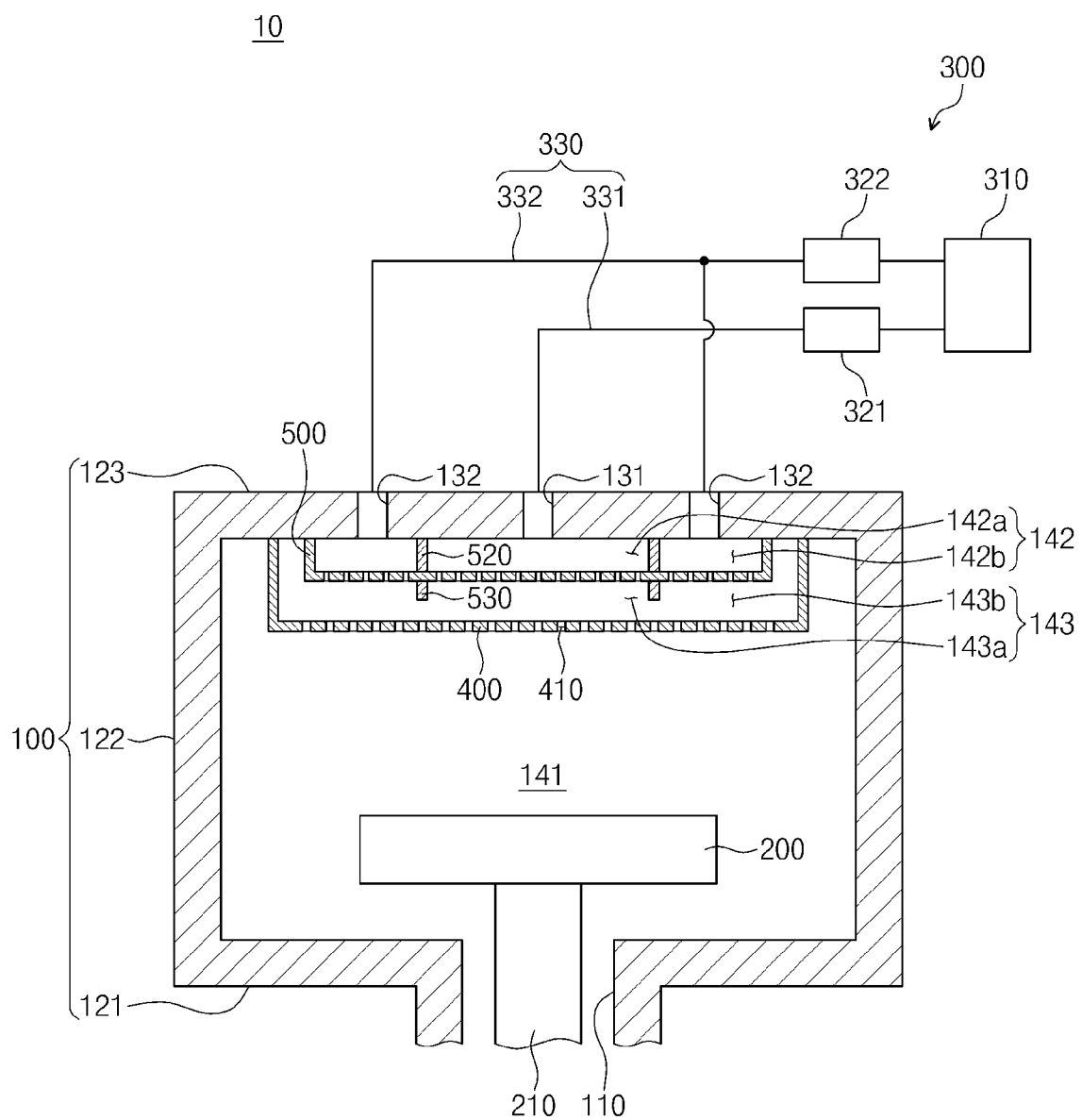
FIG. 1 illustrates a substrate treating apparatus according to an embodiment of the inventive concept.

Hereinafter, embodiments of the inventive concept will be described below in more detail with reference to the accompanying drawings. The embodiments of the inventive concept may, however, be embodied in different forms and the scope of the inventive concept should not be construed as being limited to the embodiments set forth herein. Accordingly, the shape of elements in the drawings may be exaggerated for clarity.

FIG. 1 illustrates a substrate treating apparatus according to an embodiment of the inventive concept.

Referring to FIG. 1, the substrate treating apparatus 10 includes a chamber 100, a susceptor 200, a gas supply unit 300, a shower head 400, and a blocker plate assembly 500. The substrate treating apparatus 10 performs process treatment on a substrate using a process gas ionized into a plasma state.

The chamber 100 encloses an internal space therein. The internal space provides a space in which a substrate is treated. The chamber 100 may have an opening at one side thereof. The opening serves as a passage for transporting the substrate into and out of the chamber 10. The opening may be opened and closed by a door. An exhaust hole 110 is disposed at one side of the chamber 100. For example, the exhaust hole 110 may be disposed in a bottom wall 121 or a side wall 122 of the chamber 100. The plasma in the internal space of the chamber 100 may be discharged through the exhaust hole 110. Specifically, a reaction by-product or a residual process gas in the internal space may be discharged from the internal space through the exhaust hole 110. After the substrate is completely treated, the process plasma and any by-products may be discharged through the exhaust hole 110. Furthermore, the process plasma and by-products may be discharged through the exhaust hole 110 during the process treatment. Thus, it is possible to maintain a set-up pressure in the internal space. In addition, the any gas in the internal space is discharged through the exhaust hole 110 prior to treating the substrate, thereby setting the pressure of the internal space to the set-up pressure.

The susceptor 200 is located on a lower part of the internal space to support the substrate. For example, a lower portion of the susceptor 200 may be connected to a support shaft 210 and may be spaced upward from the bottom wall 121 of the chamber 100. Alternatively, the susceptor 200 may be located on an upper surface of the bottom wall 121 of the chamber 100.

The gas supply unit 300 supplies process gas/plasma into the internal space. The gas supply unit 300 includes a storage member 310, a first regulator 321, and a second regulator 322.

The storage member 310 stores the process gas. The storage member 310 is connected to the chamber 100 through a supply line 330. The supply line 330 includes a first line 331 and a second line 332. One end of the first line 331 is connected to a first supply hole 131 disposed on a top wall 123 of the chamber 100. One end of the second line 332 is connected to a second supply hole 132 disposed on the top wall 123 of the chamber 100. The second supply hole 132 may be disposed on an outer region of the top wall 123 as compared to the first supply hole 131. A plurality of second supply holes 132 may be disposed on the top wall 123 of the chamber 100. The plurality of second supply holes 132 may be located outward from the first supply hole 131. The second line 332 may be divided to be connected to the plurality of second supply holes 132, respectively. The other end of the first line 331 and the other end of the second line 332 may be connected to the storage member 310. For example, the other end of the first line 331 and the other end of the second line 332 may be directly connected with the storage member 310. Furthermore, the other end of the first line 331 may be directly connected with the storage member 310, and the other end of the second line 332 may be configured to diverge from the first line 331. Alternatively, the other end of the second line 332 may be directly connected with the storage member 310, and the other end of the first line 331 may diverge from the second line 332.

The first regulator 321 is provided on the first line 331. The first regulator 321 may open and close the first line 331. Further, the first regulator 321 may regulate the amount of process gas or plasma to be supplied to the first supply hole 131 through the first line 331.

The second regulator 322 is provided on the second line 332. The second regulator 322 may open and close the second line 332. Further, the second regulator 322 may regulate the amount of process gas or plasma to be supplied to the second supply hole 132 through the second line 332.

The shower head 400 allows process gas or plasma flowing into the internal space to be uniformly applied, and to be applied onto the susceptor 200. The shower head 400 may have a plate shape. The shower head 400 has distribution holes 410 through which the process gas or plasma may flow. The shower head 400 is secured to the chamber 100 on the upper side of the internal space, and is spaced above the susceptor 200. A process space 141 for treatment of the substrate may be enclosed between the shower head 400 and the susceptor 200. For example, a peripheral portion of the shower head 400 may bend upward to connect to the top wall 123 of the chamber 100. Alternatively, the shower head 400 may connect to the side wall 122 of the chamber 100.

The process plasma is supplied to the process space 141. As an example, the substrate treating apparatus 10 may excite a process gas into a plasma state through a Capacitively Coupled Plasma (CCP) scheme. In particular, a power supply for exciting the process gas may be connected to the shower head 400 and the susceptor 200. In addition, the substrate treating apparatus 10 may excite the process gas into a plasma state through an Inductively Coupled Plasma (ICP) scheme. In this case, a coil for exiting the process gas may be provided outside of the chamber 100. Furthermore, the substrate treating apparatus 10 may have a remote excitation unit, and the gas supply unit 300 may supply the chamber 100 with a process gas already excited into a plasma state.

Figure 2:
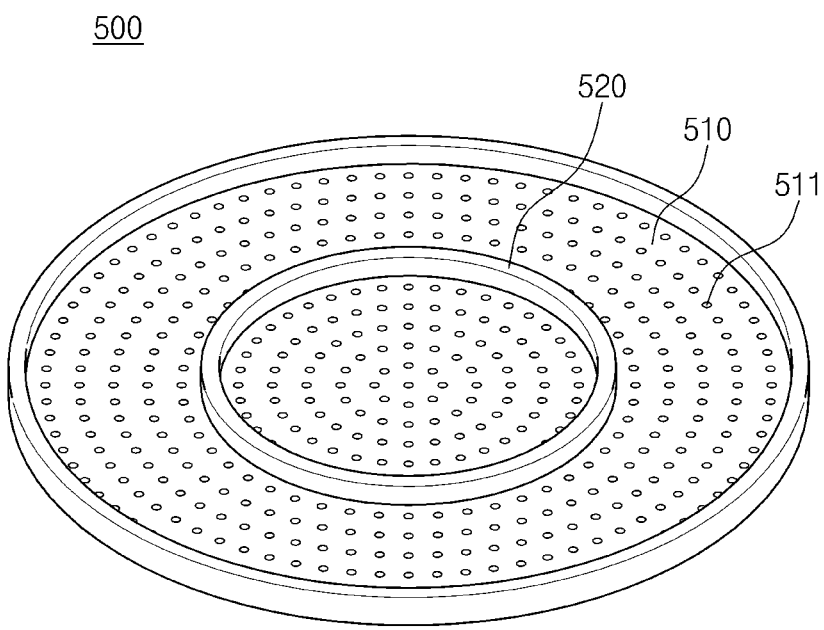
FIG. 2 is a front perspective view of a blocker plate assembly.

FIG. 2 is a front perspective view of a blocker plate assembly.

Referring to FIGS. 1 and 2, the blocker plate assembly 500 divides an internal space above the shower head 400 into an intake space 142 and a distribution space 143. The blocker plate assembly 500 may allow the process gas or plasma to spread uniformly, while assisting the shower head 400. Furthermore, the blocker plate assembly 500 may control the amount of process gas or plasma supplied to different locations.

The blocker plate assembly 500 includes a body 510, a partition rib 520, and a distribution unit 530.

The body 510 forms a frame of the blocker plate assembly 500. The body 510 is provided between the shower head 400 and the top wall 123 of the chamber 10. The body 510 may have a plate shape. The body 510 may have an outline that corresponds to a plan shape of the internal space. For example, the body 510 may have a circular plate shape. Alternatively, the body 510 may have a polygonal plate shape. The body 510 has intake holes 511 through which the process gas or plasma flows.

The body 510 is secured to an inner surface of the chamber 100 or to the shower head 400. For example, a peripheral portion of the body 510 may bend upward and be secured to the top wall 123 of the chamber 100. Alternatively, the body 510 may extend to the shower head 400 and may connect to the upwardly bent portion of the shower head 400. The intake space 142 is enclosed between the body 510 and an inner wall of the chamber 100, and the distribution space 143 is enclosed between the body 510 and the shower head 400.

The partition rib 520 is provided on an upper surface of the body 510. The partition rib 520 may have a ring shape. For example, the partition rib 520 may be a circular ring with a constant radius with respect to the center of the body 510. The partition rib 520 protruding from the upper surface of the body 510 may have a height that corresponds to a distance between the upper surface of the body 510 and the top wall 123 of the chamber 100. Accordingly, when the blocker plate assembly 500 is disposed, an upper end of the partition rib 520 may be in contact with the top wall 123 of the chamber 100. The intake space 142 is divided into a first intake space 142a and a second intake space 142b by the partition rib 520. The second intake space 142 forms a concentric circle around the first intake space 142a. The first supply hole 131 connects to the first intake space 142a, and the second supply holes 132 connect to the second intake space 142b.

Figure 3:
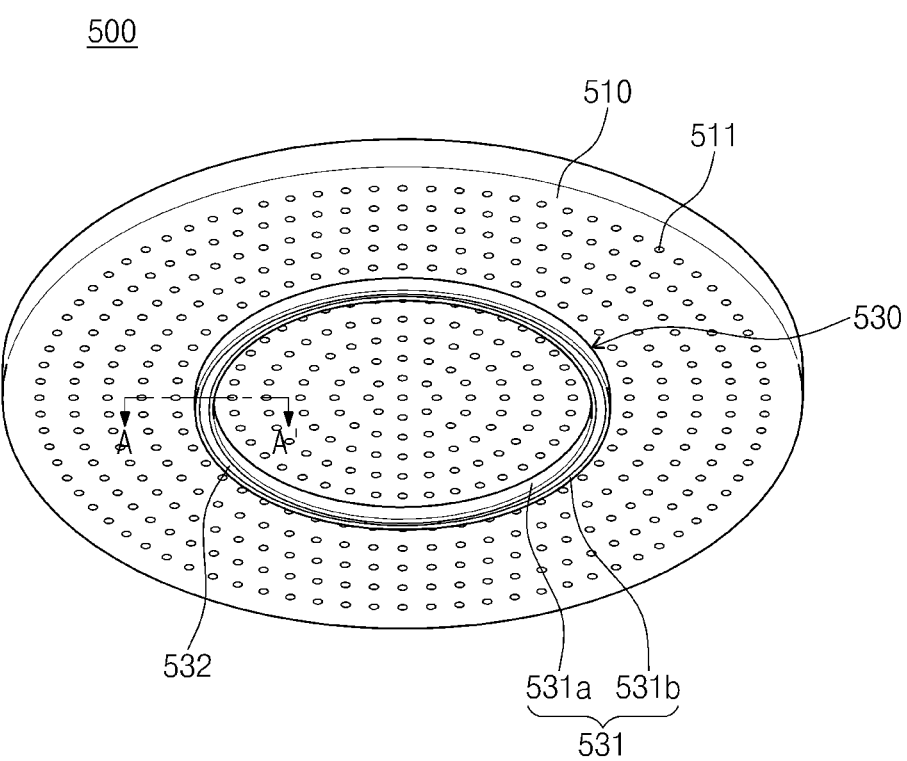
FIG. 3 is a rear perspective view of the blocker plate assembly.

FIG. 3 is a rear perspective view of the blocker plate assembly.

Referring to FIGS. 1 to 3, the distribution unit 530 is provided on a lower surface of the body 510. The distribution unit 530 has a ring shape. The distribution unit 530 may be disposed opposite to the partition rib 520, symmetric with respect to the body 510. Specifically, if the partition rib 520 has a ring shape, the distribution unit 530 may have a ring shape that is formed on a circumference with the same radius with respect to the center of the body 510 as the partition rib 520. Further, the radius of the distribution unit 530 may be greater than one third of the radius of the body 510.

The distribution unit 530 divides the distribution space 143 into a first distribution space 143a and a second distribution space 143b. The first distribution space 143a is located below the first intake space 142a, and the second distribution space 143b is located below the second intake space 142b. Some of the distribution holes 410 of the shower head 400 are located below the distribution unit 530. Specifically, some of the distribution holes 410 may be disposed in the shower head 400 along a boundary line between the first distribution space 143a and the second distribution space 143b.

Figure 4:
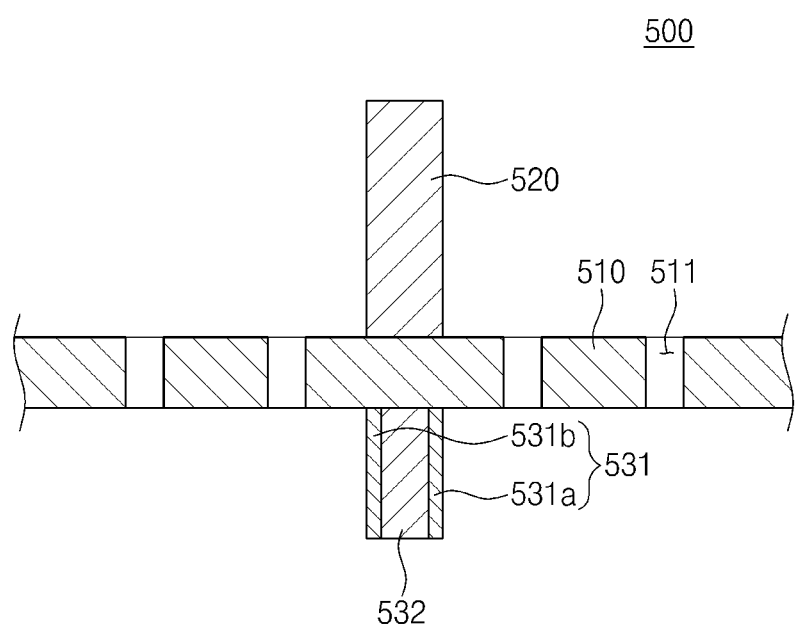
FIG. 4 is a sectional view taken along a line A-A of FIG. 3.

FIG. 4 is a sectional view taken along a line A-A of FIG. 3.

Referring to FIGS. 1 to 4, the distribution unit 530 is configured so that its height may change. The distribution unit 530 includes guides 531 and an elevating member 532.

The guides 531 extend downward from the lower surface of the body 510. The guides 531 guide a movement of the elevating member 532. Each of the guides 531 includes a first guide 531a and a second guide 531b. The first guide 531a and the second guide 531b have a ring shape and are concentric with each other. An outer surface of the first guide 531a is spaced apart from an inner surface of the second guide 531b.

The elevating member 532 is located in a space between the first guide 531a and the second guide 531b to move up and down. The elevating member 532 may have a width that corresponds to a separation distance between the first guide 531a and the second guide 531b. The substrate treating apparatus 10 may operate in one of four modes based on an operation of the gas supply unit 300 and the distribution unit 530.

Figure 5:
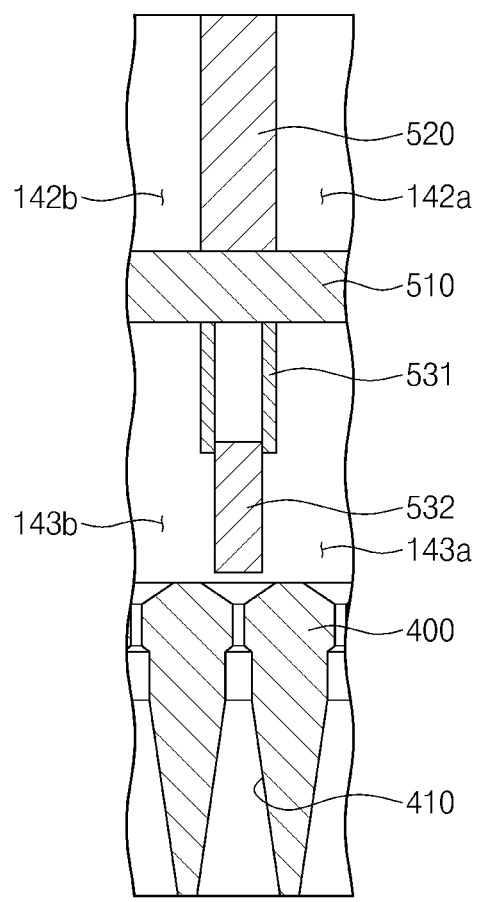
FIG. 5 is an enlarged sectional view of a shower head and a blocker plate assembly in a first and second mode.

FIG. 5 is an enlarged sectional view of the shower head and the blocker plate assembly in a first and a second mode.

Referring to FIGS. 1 to 5, the distribution unit 530 minimizes a flow of process gas/plasma between the first distribution space 143a and the second distribution space 143b in the first mode and the second mode.

The elevating member 532 moves downward in the first and second modes. At this time, the elevating member 532 may be located such that a lower end thereof is spaced above an upper surface of the shower head 400. The separation distance is set such that the process gas/plasma does not flow smoothly. Furthermore, the elevating member 532 may be located such that the lower end thereof is in contact with the upper surface of the shower head 400, and may block the flow of the process gas/plasma between the first distribution space 143a and the second distribution space 143b.

In the first mode, the gas supply unit 300 supplies most of the process gas/plasma to the first supply hole 131 rather than the second supply holes 132, while in the second mode, the reverse holds. The process gas/plasma supplied to the first supply hole 131 is applied to a central area of the substrate via the first intake space 142a and the first distribution space 143a. The process gas supplied to the second supply holes 132 is applied to an edge area of the substrate via the second intake space 142b and the second distribution space 143a.

Figure 6:
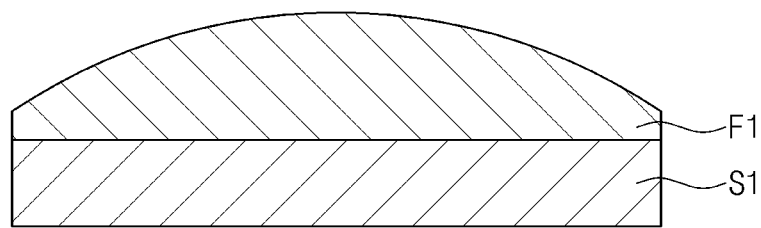
FIGS. 6 and 7 are schematic cross-sectional views of a substrate on which a deposition process is performed according to the first mode or the second mode.
Figure 7:
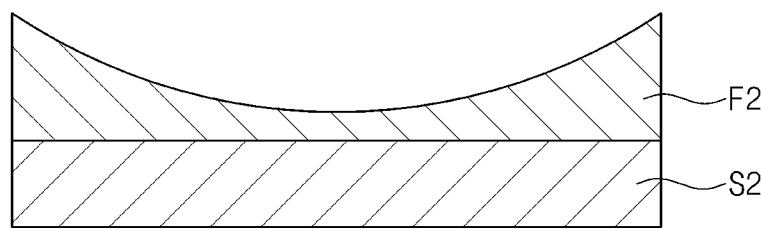

FIGS. 6 and 7 are schematic cross-sectional views of respective substrates S1 and S2 on which a deposition process is performed according to the first mode or the second mode.

A thickness of each of thin films F1 and F2 deposited on the substrates S1 and S2 may be affected by at least two conditions: (1) the amount of process gas/plasma applied to a top surface of substrates S1 and S2 and (2) a residence time during which the process gas/plasma resides on the top surface of the substrates. In particular, the influence of one of the conditions may be larger than that of the other one. Such a difference may be caused by the type of process gas/plasma supplied by the gas supply unit 300, the relative ratio of the process gas/plasma supplied to the first supply hole 131 to the process gas/plasma supplied to the second supply holes 132, etc.

First, in the case in which the thickness of the thin film F1 is mostly affected by the amount of the process gas/plasma, the thin film F1 formed at a portion of the substrate S1 that receives a relatively large amount of process gas/plasma may be thicker than that formed at another portion of the substrate S1 that received a relatively small amount of process gas/plasma. Accordingly, in the first mode, the thin film F1 deposited on the substrate S1 may have a cross-sectional shape as illustrated in FIG. 6.

Furthermore, in the case in which the thickness of the thin film F2 is mostly affected by the residence time of the process gas/plasma, the thin film F2 formed at a portion of the substrate S2 where the process gas/plasma flows relatively slowly may be thicker than that formed at another portion of the substrate S2 where the process gas/plasma flows relatively rapidly. The flow rate of the process gas/plasma with respect to the top surface of the substrate S2 may be influenced by the amount of process gas/plasma received. Specifically, in the first mode, the flow rate of the process gas/plasma in the vicinity of the top surface of the substrate S2 may be proportional to the amount of process gas received. Thus, the flow rate at the central portion of the substrate S2 may be higher than that at the peripheral portion of the substrate S2. Accordingly, in the first mode, the thin film F2 deposited on the substrate S2 may have a cross-sectional shape as illustrated in FIG. 7.

In the second mode, the gas supply unit 300 supplies most of the process gas/plasma to the second supply holes 132 rather than the first supply hole 131. Accordingly, the amount of process gas/plasma applied to the edge area of the substrates S1 and S2 is larger than that applied to the central area of the substrates S1 and S2.

First, in the case in which the thickness of the thin film is mostly affected by the amount of the process gas/plasma, the thin film F2 deposited on the substrate S2 in the second mode may have a cross-sectional shape as illustrated in FIG. 7.

On the other hand, in the case in which the thickness of the thin film is mostly affected by the residence time of the process gas/plasma, the thin film F1 deposited on the substrate S1 in the second mode may have a cross-sectional shape as illustrated in FIG. 6. Specifically, the flow rate of the process gas/plasma in the edge area of the substrate S1 is higher than that in the central area of the substrate S1 due to the amount of process gas/plasma received. In contrast, as a relatively small amount of process gas/plasma is applied to the central area of the substrate S1, the flow rate of the process gas/plasma is also relatively low. Further, the flow of the process gas/plasma applied to the central area of the substrate S1 may be obstructed by the process gas/plasma applied to the edge area of the substrate S1. Accordingly, the residence time of the process gas/plasma may be further increased at the central area of the substrate S1.

Figure 8:
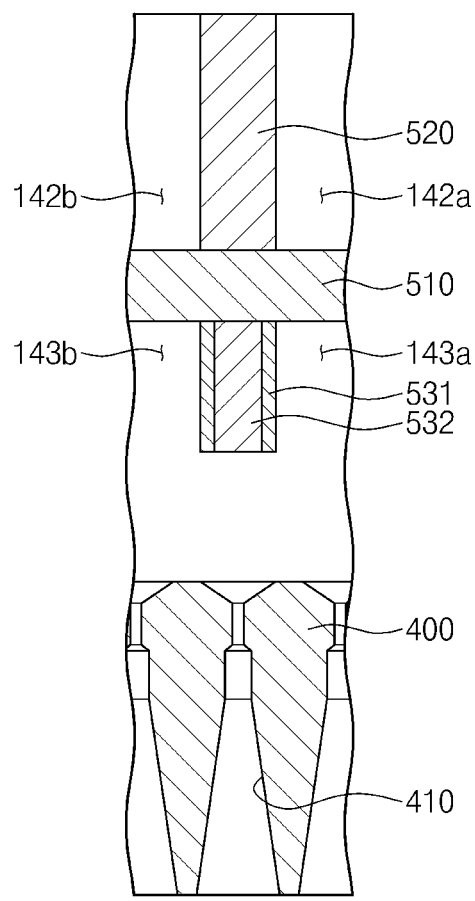
FIG. 8 is an enlarged sectional view of a shower head and a blocker plate assembly in a third and fourth mode.

FIG. 8 is an enlarged sectional view of the shower head and the blocker plate assembly in the third and fourth modes.

Referring to FIGS. 1 to 4 and 8, in the third mode and the fourth mode, the distribution unit 530 allows a predetermined amount of process gas/plasma to flow between the first distribution space 143a and the second distribution space 143b.

The elevating member 532 moves upward in the third mode and the fourth mode. At this time, the elevating member 532 may be accommodated between the guides 531, although the lower end thereof may be exposed. The lower end of the elevating member 532 may be spaced above the upper surface of the shower head 400, and the process gas/plasma may flow between the first distribution space 143a and the second distribution space 143b through a gap corresponding to the separation distance.

Figure 9:
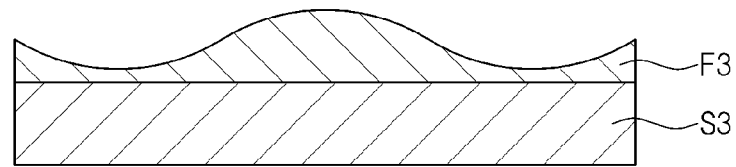
FIGS. 9 and 10 are schematic cross-sectional views of a substrate on which a deposition process is performed according to the third mode or the fourth mode.
Figure 10:
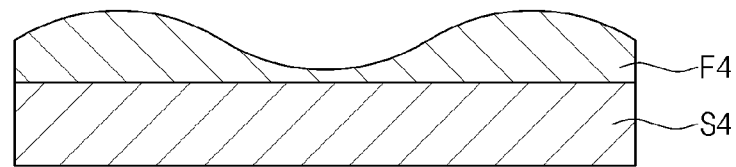

FIGS. 9 and 10 are schematic cross-sectional views of respective substrates S3 and S4 on which a deposition process is performed according to the third mode or the fourth mode.

In the third mode, the gas supply unit 300 supplies most of the process gas/plasma to the first supply hole 131 rather than the second supply holes 132. The process gas supplied to the first supply hole 131 is received by the first distribution space 143a via the first intake space 142a. The process gas supplied to the second supply holes 132 is received by the second distribution space 143b via the second intake space 142b. The pressure in the first distribution space 143a may be higher than that in the second distribution space 143b, due to a difference in the amount of process gas/plasma. Accordingly, in an area between the first and second distribution spaces 143a and 143b, the process gas/plasma flows in a direction from the first distribution space 143a to the second distribution space 143b. Due to the flow of the process gas/plasma, a density of the process gas/plasma at a central area may be higher than that at an edge area in the first distribution space 143a. Further, since the process gas/plasma may be compressed at an edge area of the second distribution space 143b, a density of the process gas/plasma may gradually increase. Moreover, some of the distribution holes 410 may be located below the distribution unit 530. Accordingly, with the flow of the process gas/plasma, the change in the amount of process gas/plasma between the first distribution space 143a and the second distribution space 143b may be due to the amount of process gas/plasma supplied to the process space 141. Thus, in the third mode, the process gas/plasma received from the shower head 400 by the process space 141 may have a W-shaped density distribution.

In the case in which the thickness of the thin film is mostly affected by the amount of process gas/plasma, the thin film F3 deposited on the substrate S3 in the third mode may have a cross-sectional shape as illustrated in FIG. 9.

In contrast, in the case in which the thickness of the thin film is mostly affected by the residence time of the process gas/plasma, the thin film F4 deposited on the substrate S4 in the third mode may have a cross-sectional shape as illustrated in FIG. 10.

In the fourth mode, the gas supply unit 300 supplies most of the process gas/plasma to the second supply holes 132 rather than the first supply hole 131. The process gas/plasma supplied to the first supply hole 131 is received by the first distribution space 143a via the first intake space 142a. The process gas/plasma supplied to the second supply holes 132 is received by the second distribution space 143b via the second intake space 142b. The pressure in the second distribution space 143b may be higher than that in the first distribution space 143a due a difference in the amount of process gas/plasma. Accordingly, in an area between the first and second distribution spaces 143a and 143b, the process gas/plasma flows in a direction from the second distribution space 143b to the first distribution space 143a. A volume of space gradually decreases with the flow of the process gas/plasma from the second distribution space 143b to the first distribution space 143a. Accordingly, the process gas/plasma received from the second distribution space 143b by the first distribution space 143a has a higher density depending on the decrease of the volume. The density of the process gas/plasma may be highest in the vicinity of the distribution unit 530 around which the largest amount of process gas/plasma flows. Moreover, some of the distribution holes 410 may be located below the distribution unit 530. Accordingly, the change in the amount of process gas/plasma in the first distribution space 143a and the second distribution space 143b when the process gas/plasma flows may be due to the amount of the process gas/plasma received by the process space 141. Thus, in the fourth mode, the process gas/plasma received from the shower head 400 by the process space 141 may have an M-shaped density distribution.

In the case in which the thickness of the thin film is mostly affected by the residence time of the process gas/plasma, the thin film F3 deposited on the substrate S3 in the fourth mode may have a cross-sectional shape as illustrated in FIG. 9.

In contrast, in the case in which the thickness of the thin film is mostly affected by the amount of the process gas/plasma, the thin film F4 deposited on the substrate S4 in the fourth mode may have a cross-sectional shape as illustrated in FIG. 10.

The performance of a deposition process on a substrate by the substrate treating apparatus 10 has been described above. However, the substrate treating apparatus 10 may also perform an etching process or an ashing process on the substrate.

Figure 11:
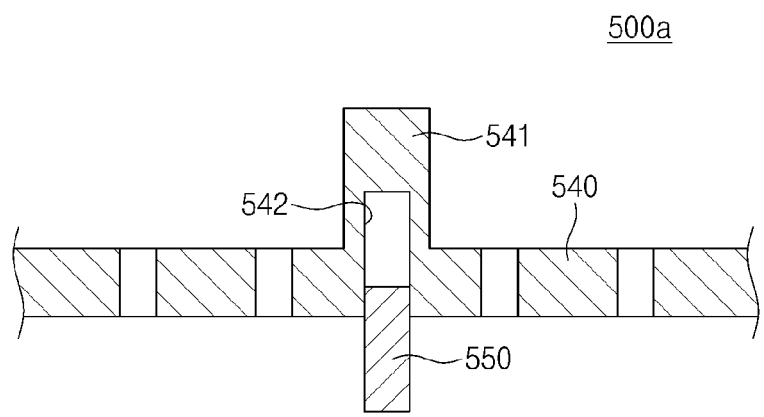
FIG. 11 is a fragmentary longitudinal sectional view of a blocker plate assembly provided with a distribution unit according to an embodiment of the inventive concept.

FIG. 11 is a fragmentary longitudinal sectional view of a blocker plate assembly 500a provided with a distribution unit according to an embodiment of the inventive concept.

Referring to FIG. 11, the distribution unit may be implemented as an elevating member 550. The elevating member 550 is located on a lower surface of a body 540 and is configured to move up and down. The elevating member 550 has a ring shape. The elevating member 550 may be located symmetrically to a partition rib 541 with respect to the body 540. The elevating member 550 may be located in an accommodation part 542, which is a ring-shaped groove in the lower surface of the body 540, to move up and down. The accommodation part 542 may extend from the body 540 into the partition rib 541. Alternatively, the accommodation part 542 may be formed only in the body 540. A width of the elevating member 550 is smaller than that of the partition rib 541.

Figure 12:
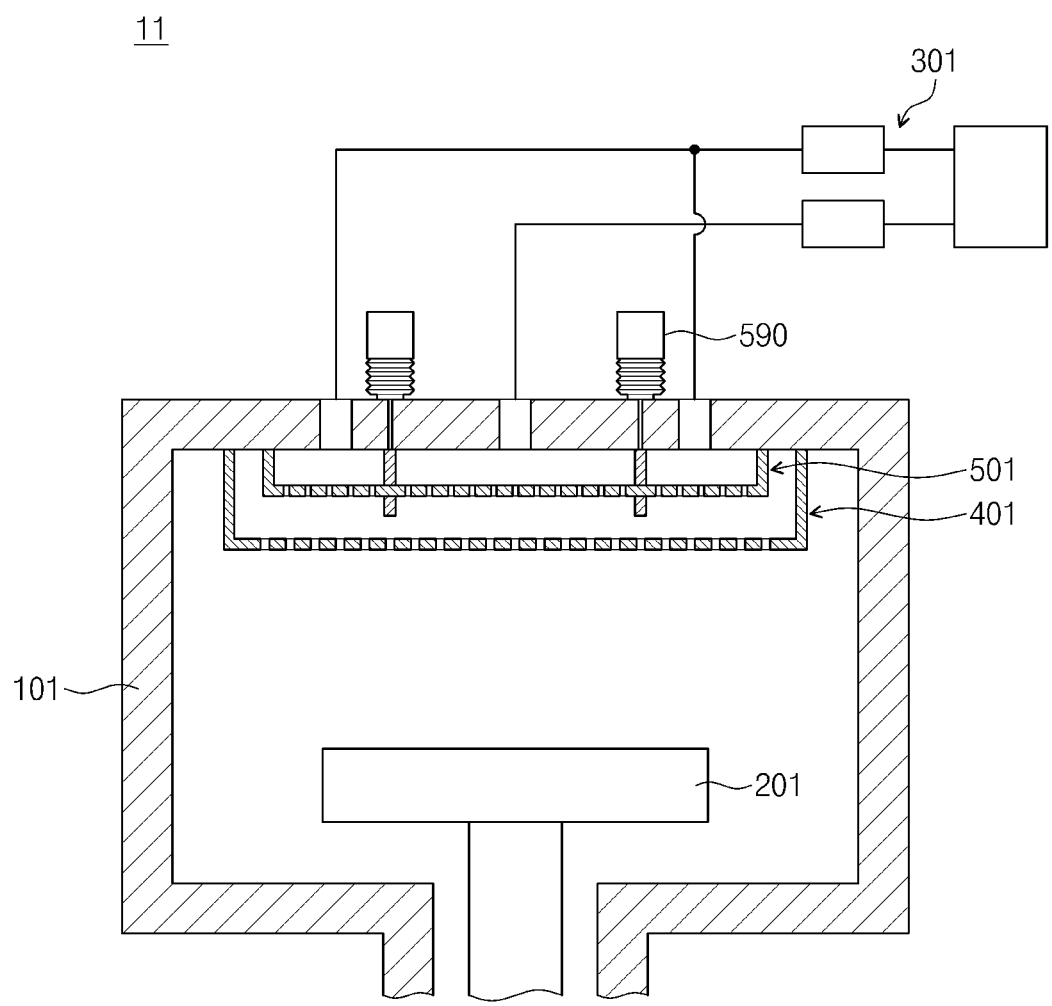
FIG. 12 illustrates a substrate treating apparatus according to another embodiment of the inventive concept.
Figure 13:
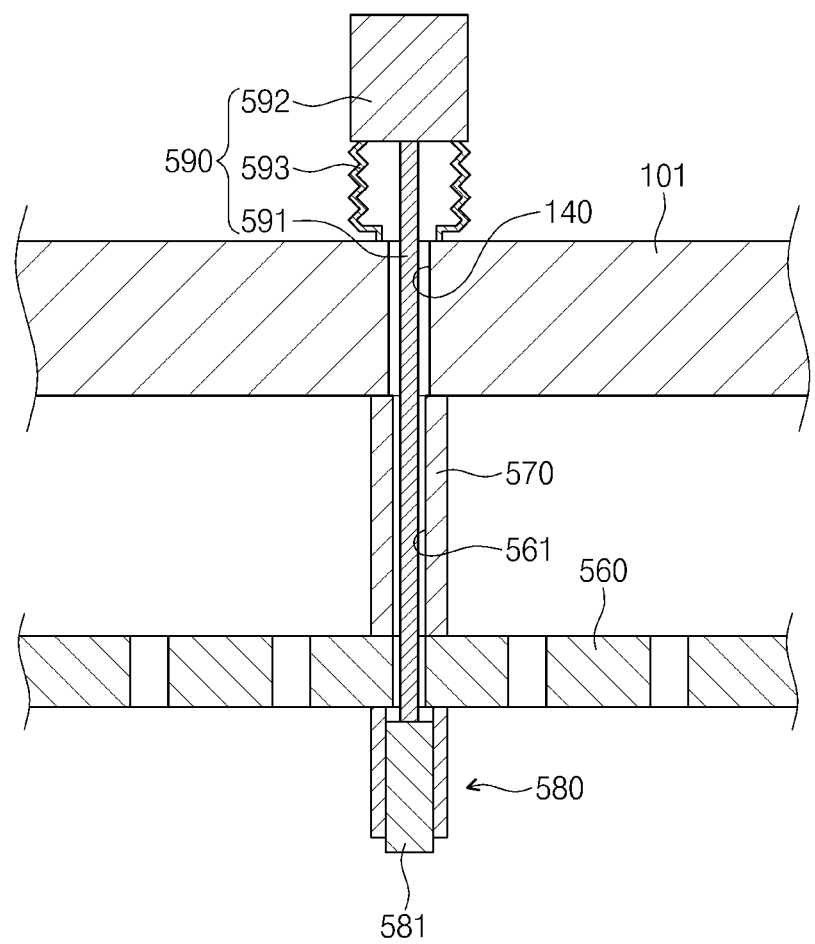
FIG. 13 is a fragmentary longitudinal sectional view of a blocker plate assembly and a chamber according to another embodiment of the inventive concept.

FIG. 12 illustrates a substrate treating apparatus according to another embodiment of the inventive concept, and FIG. 13 is a fragmentary longitudinal sectional view of a blocker plate assembly and a chamber according to another embodiment of the inventive concept.

Referring to FIGS. 12 and 13, the substrate treating apparatus 11 includes a chamber 101, a susceptor 201, a gas supply unit 301, a shower head 401, and a blocker plate assembly 501.

Configurations of the chamber 101, the susceptor 201, and the gas supply unit 310, except for the blocker plate assembly 501 and parts coupled with the blocker plate assembly 501 in the chamber 101, may be substantially the same as those of the substrate treating apparatus 10 illustrated in FIG. 1, and repeated descriptions thereof will be thus omitted.

The blocker plate assembly 501 includes a body 560, a partition rib 570, a distribution unit 580, and a driving unit 590.

Except for the parts connected with the driving unit 590, the body 560, the partition rib 570, and the distribution unit 580 are substantially the same as the body 510, the partition rib 520, and the distribution unit 530, respectively, which are included in the blocker plate assembly 500 illustrated in FIGS. 1 to 4, and therefore, repeated descriptions thereof will be omitted. In addition, the distribution unit 580 may be substantially similar to the distribution unit 550 illustrated in FIG. 11.

The driving unit 590 includes a connecting member 591 and a driving member 592.

The connecting member 591 connects an elevating member 581 and the driving member 592. An elevation hole 561 is disposed in the body 560 that extends up through the partition rib 570 that encloses the connecting member 591. A connection hole 140 is disposed in the top wall 123 of the chamber 101 to be aligned with the elevation hole 561. The connecting member 591 may be a rod having a cross section corresponding to that of the elevation hole 561 and the connection hole 140. One end of the connecting member 591 is connected with the elevating member 581, and the other end thereof is connected with the driving member 592 outside of the chamber 101.

The driving member 592 applies power to the connecting member 591 such that the connecting member 591 can move up and down through the elevation hole 561 and the connection hole 140. For example, the driving member 592 may include a cylinder connected with the connecting member 591, and may move the connection member 591 using hydraulic pressure. Further, the driving member 592 may be include a motor and a structure for transferring power from the motor to the connecting member 591. Moreover, the driving member 592 may be configured such that a worker may manually adjust a movement of the connecting member 591. For example, the driving member 592 may be configured for adjusting the movement of the connecting member 591 through a bolt and nut structure. In addition, the driving member 592 may be have markings so that a worker may measure movement of the connecting member 591.

A shielding member 593 may be provided between the driving member 592 and the chamber 101. The shielding member 593 encloses the connection hole 140 to shield it from the outside. The shielding member 593 has a tube shape and is provided therein with the connecting member 591. One end of the shielding member 593 may be connected to an outer side of the chamber 101, and the other end thereof may be connected to the driving member 592. Further, the shielding member 593 may be resilient or otherwise configured to vary its length. Accordingly, in an operation of the driving member 592, the shielding member 593 may be prevented from being damaged by a movement or vibration of the driving member 592.

The detailed descriptions are just examples of the inventive concept. The foregoing details have been described as exemplary embodiments of the inventive concept and a variety of combinations, modifications, and changes of the exemplary embodiments of inventive concept may be made. In particular, it should be apparent to those skilled in the art that modifications and changes to exemplary embodiments of the inventive concept can be made within the scope of the equivalents and/or the techniques or the knowledge in the art. Exemplary embodiments have been described to explain the inventive concept, and specific applied fields and applications of exemplary embodiments of the inventive concept may be changed. Accordingly, the detailed description of exemplary embodiments is not intended to limit the inventive concept. Furthermore, the appended claims should be construed as comprising other embodiments.

What is claimed is:

1. A substrate treating apparatus comprising:
   a chamber that encloses an internal space;
   a susceptor that is located in a lower part of the internal space;
   a shower head that is located in an upper part of the internal space spaced above the susceptor that includes a plurality of distribution holes; and
   a blocker plate assembly that comprises a body that divides a space between a top wall of the chamber and the shower head into an intake space in an upper part of the space and a distribution space in a lower part of the space and includes a plurality of intake holes, a ring-shaped partition rib on an upper surface of the body, and a ring-shaped distribution unit on a lower surface of the body;
   wherein a height of the distribution unit is adjustable;
   wherein the distribution unit comprises:
   a pair of concentric guides spaced apart from each other that extend downward from the lower surface of the body; and
   an elevating member disposed between the guides that is configured to move up and down.

2. The substrate treating apparatus of claim 1, wherein the blocker plate assembly further comprises a driving unit configured to move the elevating member up and down.

3. The substrate treating apparatus of claim 2, wherein the driving unit comprises:
   a connecting member that has one end connected to the elevating member; and
   a driving member outside of the chamber, connected to an other end of the connecting member, that is configured to move the connecting member up and down, and
   wherein an elevation hole that encloses the connecting member is disposed in the body and the partition rib, and is aligned with a connection hole disposed in the top wall of the chamber.

4. The substrate treating apparatus of claim 3, further comprising:
   a tube-shaped shielding member that encloses the connecting member and has one side connected to an outside of the chamber and the other side connected to the driving member.

5. The substrate treating apparatus of claim 1, wherein the blocker plate assembly includes an accommodation part with a ring-shaped groove disposed on the lower surface of the body, and the distribution unit is an elevating member disposed in the accommodation part that is configured to move up and down.

6. The substrate treating apparatus of claim 1, wherein the distribution unit is disposed symmetric to the partition rib with respect to the body.

7. The substrate treating apparatus of claim 1, wherein some of the plurality of distribution holes are disposed below the distribution unit.

8. The substrate treating apparatus of claim 1, wherein a radius of the distribution unit from the center of the body is greater than one third of a radius of the body of the blocker plate assembly.

9. A substrate treating apparatus comprising:
   a chamber that encloses an internal space;
   a shower head that is located in an upper part of the internal space that includes a plurality of distribution holes;
   a blocker plate assembly that comprises a body that divides a space between a top wall of the chamber and the shower head into an upper intake space and a lower distribution space and that includes a plurality of intake holes, a ring-shaped partition rib on an upper surface of the body, and a ring-shaped distribution unit on a lower surface of the body opposite the ring-shaped partition rib,
   wherein the distribution unit has a height below the body that is adjustable and is configured to come in contact with the shower head;
   wherein the distribution unit comprises:
   a pair of concentric guides spaced apart from each other that extend downward from the lower surface of the body; and an elevating member disposed between the guides that is configured to move up and down, wherein the elevating part is configured to come in contact with the shower head.

10. The substrate treating apparatus of claim 9, further comprising a susceptor that is located in a lower part of the internal space and spaced below the shower head.

11. The substrate treating apparatus of claim 9, wherein the blocker plate assembly further comprises:

a driving unit configured to move the elevating member up and down that has a connecting member with a first end connected to the elevating member, a driving member outside of the chamber connected to a second end of the connecting member opposite of the first end that is configured to move the connecting member up and down, and a tube-shaped shielding member that encloses the connecting member and has one side connected to an outside of the chamber and the other side connected to the driving member; and an elevation hole disposed in the body and the partition rib that encloses the connecting member and is aligned with a connection hole disposed in the top wall of the chamber.

12. The substrate treating apparatus of claim 9, wherein the blocker plate assembly includes an accommodation part with a ring-shaped groove disposed on the lower surface of the body, and the distribution unit is an elevating member disposed in the accommodation part that is configured to move up and down.

\* \* \* \* \*